(12) United States Patent
Ha et al.

(10) Patent No.: US 11,177,776 B2
(45) Date of Patent: Nov. 16, 2021

(54) AMPLIFYING DEVICE WITH BIAS TIMING CONTROL CIRCUIT BASED ON DUTY CYCLE

(71) Applicant: Samsung Electro-Mechanics Co., Ltd., Suwon-si (KR)

(72) Inventors: Jong Ok Ha, Suwon-si (KR); Byeong Hak Jo, Suwon-si (KR); Jeong Hoon Kim, Suwon-si (KR); Young Wong Jang, Suwon-si (KR); Shinichi Iizuka, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 133 days.

(21) Appl. No.: 16/654,527

(22) Filed: Oct. 16, 2019

(65) Prior Publication Data

US 2020/0366251 A1    Nov. 19, 2020

(30) Foreign Application Priority Data

May 17, 2019    (KR) .......................... 10-2019-0057916

(51) Int. Cl.
*H03F 3/04*    (2006.01)
*H03F 1/30*    (2006.01)
*H03F 3/217*    (2006.01)

(52) U.S. Cl.
CPC .......... *H03F 1/304* (2013.01); *H03F 3/2175* (2013.01); *H03F 2203/21127* (2013.01); *H03F 2203/21131* (2013.01)

(58) Field of Classification Search
CPC ................. H03F 1/304; H03F 3/2175; H03F 2203/21131; H03F 2203/21127; H03F 2200/451; H03F 3/19; H03F 2200/507; H03F 1/0266; H03F 3/245; H03K 3/017; H03M 1/54
USPC .................................. 330/51, 296, 311, 385
See application file for complete search history.

(56) References Cited

U.S. PATENT DOCUMENTS

| 9,628,029 | B2 | 4/2017 | Huang et al. |
| 9,825,591 | B2 | 11/2017 | Lam et al. |
| 9,843,293 | B1 * | 12/2017 | Wagh ...................... H03F 3/193 |
| 2013/0034144 | A1 | 2/2013 | Doherty et al. |

* cited by examiner

*Primary Examiner* — Khanh V Nguyen
*Assistant Examiner* — Khiem D Nguyen
(74) *Attorney, Agent, or Firm* — NSIP Law

(57) ABSTRACT

A bias timing control circuit includes a current source, a bias switch circuit, a duty cycle sensing circuit, and a switching control circuit. The bias switch circuit includes a first path switch, connected between an output node of the current source and a bias amplifying circuit, and a second path switch, connected between the output node of the current source and a temperature compensation circuit. The duty cycle sensing circuit is configured to generate a timing control signal based on a duty cycle of a transmission enable signal. The switching control circuit is configured to control a first turn-on time of the first path switch during an initial startup period, and a second turn-on time of the second path switch during a normal driving period subsequent to the initial startup period to adjust a warm-up time of a power amplifying circuit based on the timing control signal.

16 Claims, 17 Drawing Sheets

AMPLIFYING DEVICE WITH BIAS TIMING CONTROL CIRCUIT BASED ON DUTY CYCLE

CROSS-REFERENCE TO RELATED APPLICATION(S)

This application claims the benefit under 35 U.S.C. § 119(a) of Korean Patent Application No. 10-2019-0057916 filed on May 17, 2019 in the Korean Intellectual Property Office, the entire disclosure of which is incorporated herein by reference for all purposes.

BACKGROUND

1. Field

The present disclosure relates to a bias timing control circuit, and a power amplifying device based on a duty cycle of a transmission enable signal.

2. Description of Related Art

Generally, wireless communication methods include a time division duplexing (TDD) method and a frequency division duplexing (FDD) method. The TDD and FDD methods are used to communicate with a greater number of users with limited resources. The TDD method is a method of communicating with a plurality of users by diving the time of communication at the same frequency at a predetermined interval. The FDD method is a method of communicating by assigning different frequencies to each user.

The conventional TDD method is a method of communicating with a plurality of users by allocating time slots in the same frequency band at a constant interval. In the TDD method, since communication is performed using one frequency and allocating time slots for communication, transmission and reception are repeatedly switched in a process of communication.

Accordingly, a transmitter and a receiver having a fast response time is desirable for the performance factor in TDD communications, and the amplifying circuit included in the transmitter and the receiver also requires a fast response time.

However, in order to improve the response time of the conventional transmitter, it may be necessary to further improve the response time of the power amplifier of the transmitter. In particular, it may be desirable for the power amplifier to quickly reach a normal state within a short amount of time at a starting time or initialization.

In particular, a transmission enable signal of the power amplifier has a duty cycle. Since heating and cooling cycles are related to the duty cycle of an amplifier, the heat generated in the power amplifier changes based on its duty cycle. In an example of an amplifier gain affecting a linearity index (e.g., EVM) performance, greater temperature changes during the operation of a power amplifier may result in a more significant deterioration of the power amplifier.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bias timing control circuit includes a current source, a bias switch circuit, a duty cycle sensing circuit, and a switching control circuit. The current source is configured to generate a reference current. The bias switch circuit includes a first path switch, connected between an output node of the current source and a bias amplifying circuit, and a second path switch, connected between the output node of the current source and a temperature compensation circuit. The duty cycle sensing circuit is configured to generate a timing control signal based on a duty cycle of a transmission enable signal. The switching control circuit is configured to control a first turn-on time of the first path switch during an initial startup period, and a second turn-on time of the second path switch during a normal driving period subsequent to the initial startup period to adjust a warm-up time of a power amplifying circuit based on the timing control signal.

The timing control signal may include a code value corresponding to the duty cycle of the transmission enable signal.

The switching control circuit may be further configured to control a time interval between the first turn-on time and the second turn-on time by controlling a magnitude of a charging or discharging current based on the timing control signal.

The duty cycle sensing circuit may include a signal detection circuit configured to generate a first switch signal synchronized with the transmission enable signal and a second switch signal in an inverted relationship with the first switch signal, a duty cycle signal generating circuit configured to perform a charging operation based on the first switch signal and a discharging operation based on the second switch signal to generate a duty cycle signal, and an A/D converter configured to generate the timing control signal having a code value corresponding to a voltage magnitude of the duty cycle signal.

The duty cycle sensing circuit may include a signal detection circuit configured to generate a first switch signal synchronized with the transmission enable signal and a second switch signal in an inverted relationship with the first switch signal, a duty cycle signal generating circuit configured to perform a charging operation based on the second switch signal and a discharging operation based on the first switch signal, and an A/D converter configured to generate the timing control signal having a code value corresponding to a voltage magnitude of the duty cycle signal.

The switching control circuit may include a first constant current source configured to generate a first constant current, a second constant current source configured to generate a second constant current, a first capacitor circuit configured to perform a charge-charging based on the first constant current to output a first charging voltage, a second capacitor circuit configured to perform the charge-charging based on the second constant current to output a second charging voltage, a discharging control circuit configured to compare the first charging voltage with a first reference voltage and control output cutoff and discharging of the first and second constant current sources including a level according to the comparison result, a discharging circuit configured to discharge each of the first capacitor circuit and the second capacitor circuit in response to the control of the discharging control circuit, a first comparison circuit configured to compare the second charging voltage with a second reference voltage to output a first control signal including a level according to the comparison result, and a second comparison circuit configured to compare the first charging voltage with a second reference voltage to output a second control signal including a level according to the comparison result.

The switching control circuit may be further configured to control the first path switch to be in a turned-on state and the second path switch to be in a turned-off state in the initial startup period, based on the transmission enable signal, and control both the first path switch and the second path switch to be in the turned-on state in the normal driving period.

The current source may be further configured to generate a first reference current during the initial startup period and output the first reference current as a reference current, and generate an added combination of the first reference current and a second reference current during the normal driving period as the reference current. The first path switch may be configured to supply the first reference current to the bias amplifying circuit as the first current in the initial startup period, and supply the added combination of the reference current and the second reference current to the bias amplifying circuit in the normal driving period. The second path switch may be configured to supply the added combination of the first reference current and the second reference current to the temperature compensation circuit in the normal driving period. The bias amplifying circuit may be configured to receive the first current based on the first reference current during the initial startup period or branched from the reference current of the added combination of the first reference current and the second reference current during the normal driving period to provide a base bias voltage to the power amplifying circuit. The temperature compensation circuit may be configured to receive the added combination of the first reference current and the second reference current during the normal driving period to compensate temperature characteristics of the bias amplifying circuit and the power amplifying circuit, the second current in the normal driving period may be greater than the first current in the normal driving period.

In another general aspect, an amplifying device includes a current source, a power amplifying circuit, a bias amplifying circuit, a temperature compensation circuit, a bias switch circuit, a duty cycle sensing circuit, and a switching control circuit. The current source is configured to generate a reference current. The power amplifying circuit is connected between an input terminal and an output terminal. The bias amplifying circuit is configured to, receive a first current based on the reference current to provide a base bias voltage, to the power amplifying circuit. The temperature compensation circuit is configured to receive a second current based on the reference current to compensate temperature characteristics of the bias amplifying circuit and the power amplifying circuit. The bias switch circuit includes a first path switch configured to switch a path of the first current connected between an output node of the current source and the bias amplifying circuit, and a second path switch configured to switch a path of the second current connected between the output node of the current source and the temperature compensation circuit. The duty cycle sensing circuit is configured to generate a timing control signal based on a duty cycle of a transmission enable signal. The switching control circuit is configured to control a first turn-on time of the first path switch during an initial startup period and a second turn-on time of the second path switch during a normal driving period subsequent to the initial startup period to adjust a warm-up time of the power amplifying circuit based on the timing control signal.

The timing control signal may have a code value corresponding to the duty cycle of the transmission enable signal.

The switching control circuit may be further configured to control a time interval between the first turn-on time and the second turn-on time by controlling a magnitude of a charging or discharging current based on the timing control signal.

The duty cycle sensing circuit may include a signal detection circuit configured to generate a first switch signal synchronized with the transmission enable signal and a second switch signal in an inverted relationship with the first switch signal, a duty cycle signal generating circuit configured to perform a charging operation based on the first switch signal and a discharging operation based on the second switch signal to generate a duty cycle signal, and an A/D converter configured to generate the timing control signal having a code value corresponding to a voltage magnitude of the duty cycle signal.

The duty cycle sensing circuit may include a signal detection circuit configured to generate a first switch signal synchronized with the transmission enable signal and a second switch signal in an inverted relationship with the first switch signal, a duty cycle signal generating circuit configured to perform a charging operation based on the second switch signal and perform a discharging operation based on the first switch signal to generate a duty cycle signal, and an A/D converter configured to generate the timing control signal having a code value corresponding to the voltage magnitude of the duty cycle signal.

The switching control circuit may include a first constant current source configured to generate a first constant current, a second constant current source configured to generate a second constant current, a first capacitor circuit configured to perform a charge-charging based on the first constant current to output a first charging voltage, a second capacitor circuit configured to perform the charge-charging based on the second constant current to output a second charging voltage, a discharging control circuit configured to compare the first charge voltage with a first reference voltage and control output cutoff and discharging of the first and second constant current sources including a level according to the comparison result thereof, a discharging circuit configured to discharge each of the first capacitor circuit and the second capacitor circuit in response to a control of the discharging control circuit, a first comparison circuit configured to compare the second charging voltage with a second reference voltage to output a first control signal including a level according to the comparison result, and a second comparison circuit configured to compare the first charging voltage with the second reference voltage to output a second control signal including a level according to the comparison result thereof.

The switching control circuit may be further configured to control the first path switch to be in a turned-on state and the second path switch to be in an off state in an initial startup period, based on the transmission enable signal, and control both the first path switch and the second path switch to be in the turned-on state in the normal driving period.

The current source may be further configured to generate a first reference current during the initial startup period and output the first reference current as a reference current, generate an added combination of the first reference current and a second reference current during the normal driving period to output the reference current. The first path switch may be configured to supply the first reference current to the bias amplifying circuit as the first current in the initial startup period, and supply the added combination of the first reference current and the second reference current to the bias amplifying circuit in the normal driving period. The second path switch may be configured to supply the added combination of the first reference current and the second reference current to the temperature compensation circuit in the normal driving period. The bias amplifying circuit may be configured to receive the first current based on the first reference current during the initial startup period or branched from the reference current during the normal driving period to provide the base bias voltage to the power amplifying circuit. The temperature compensation circuit may be configured to receive the second current branched from the reference current during the normal driving period to compensate temperature characteristics of the bias amplifying circuit and the power amplifying circuit, the second current in the normal driving period being greater than the first current in the normal driving period.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Figure 1:
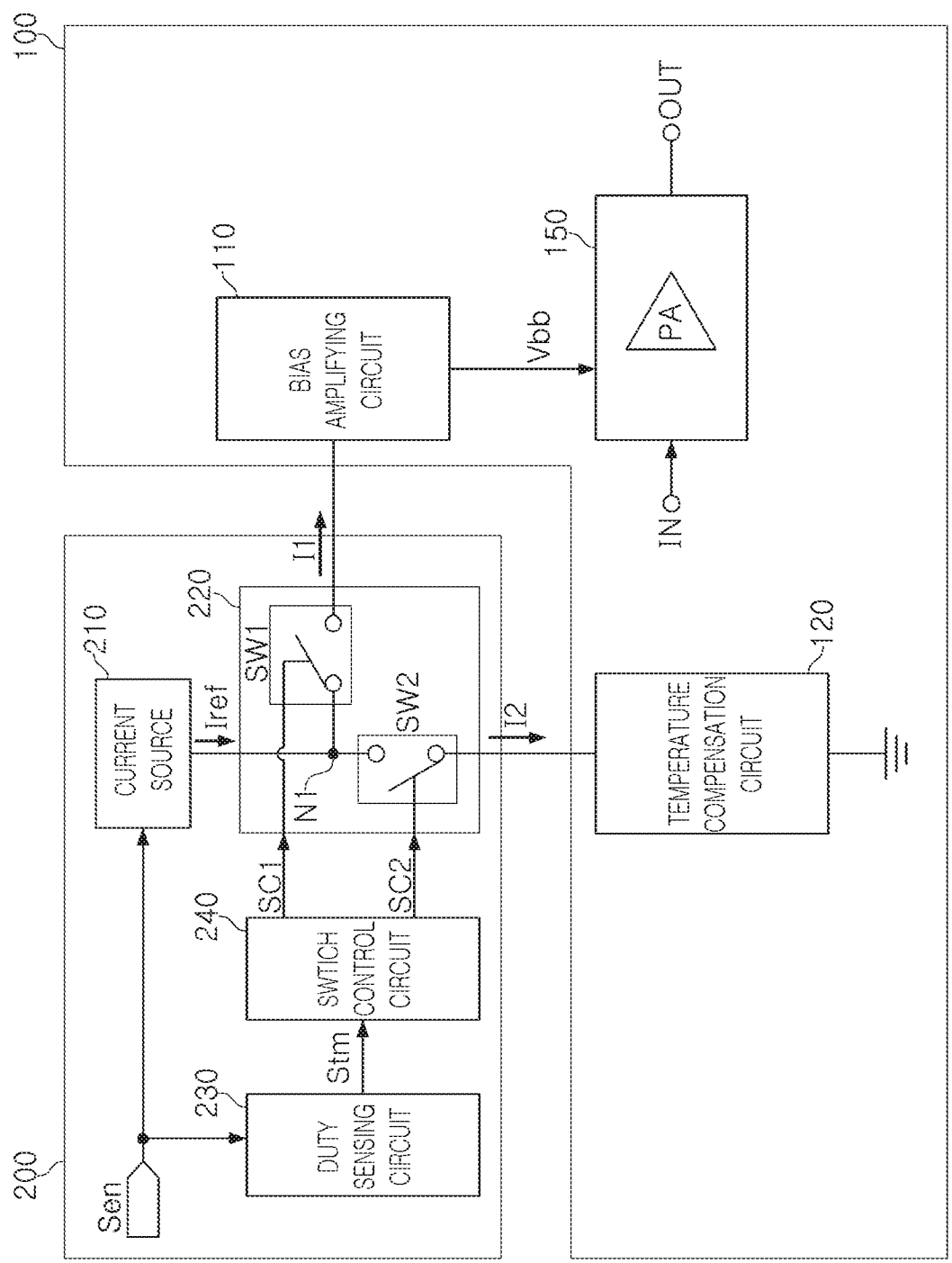
FIG. 1 is an example view of a bias timing control circuit and an amplifying device according to a first embodiment of the present disclosure.

FIG. 1 is an example view of a bias timing control circuit and an amplifying device according to a first embodiment of the present disclosure.

Referring to FIG. 1, an amplifying device according to an embodiment of the present disclosure may include a power amplifying circuit part 100 and a bias timing control circuit 200. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The power amplifying circuit part 100 may include a bias amplifying circuit 110, a temperature compensation circuit 120, and a power amplifying circuit 150.

The bias amplifying circuit 110 may receive a current I1 operating in an initial startup period and branched from a reference current Iref to provide a base bias voltage Vbb to the power amplifying circuit 150.

The temperature compensation circuit 120 may receive a second current I2, operating in the normal driving period and branched from the reference current Iref to compensate temperature characteristics of the bias amplifying circuit 110 and the power amplifying circuit 150.

The power amplifying circuit 150 may include a power amplifier PA connected between an input terminal IN and an output terminal OUT. The power amplifying circuit 150 may be preheated (warmed-up) by the base bias voltage Vbb supplied in the initial startup period, may operate in a normal state by the base bias voltage Vbb, and may amplify a signal input through the input terminal IN to output the amplified signal through the output terminal OUT.

The bias timing control circuit 200 may include a current source 210, a bias switch circuit 220, a duty cycle sensing circuit 230, and a switching control circuit 240.

The current source 210 may generate the reference current Iref.

The bias switch circuit 220 may include a first path switch SW1 and a second path switch SW2. The first path switch SW1 may switch a path of the current I1 connected between an output node N1 of the current source 210 and the bias amplifying circuit 110. The second path switch SW2 may switch a path of the second current I2 connected between the output node N1 of the current source 210 and a temperature compensation circuit 120.

The duty cycle sensing circuit 230 may generate a timing control signal Stm based on a duty (a duty cycle) of a transmission enable signal Sen.

The switching control circuit 240 may control a first turn-on time of the first path switch SW1 for starting an initial startup period (T2 to T3 of FIGS. 16 and 17) and a second turn-on time of the second path switch SW2 for starting a normal driving period (after T3 of FIGS. 16 and 17) after the initial startup period (T2 to T3 of FIGS. 16 and 17) so as to adjust a preheating time of a power amplifying circuit 150, based on the timing control signal Stm.

For example, the duty cycle sensing circuit 230 may generate a timing control signal Stm having a code value corresponding to the duty cycle of the transmission enable signal Sen.

Figure 15:
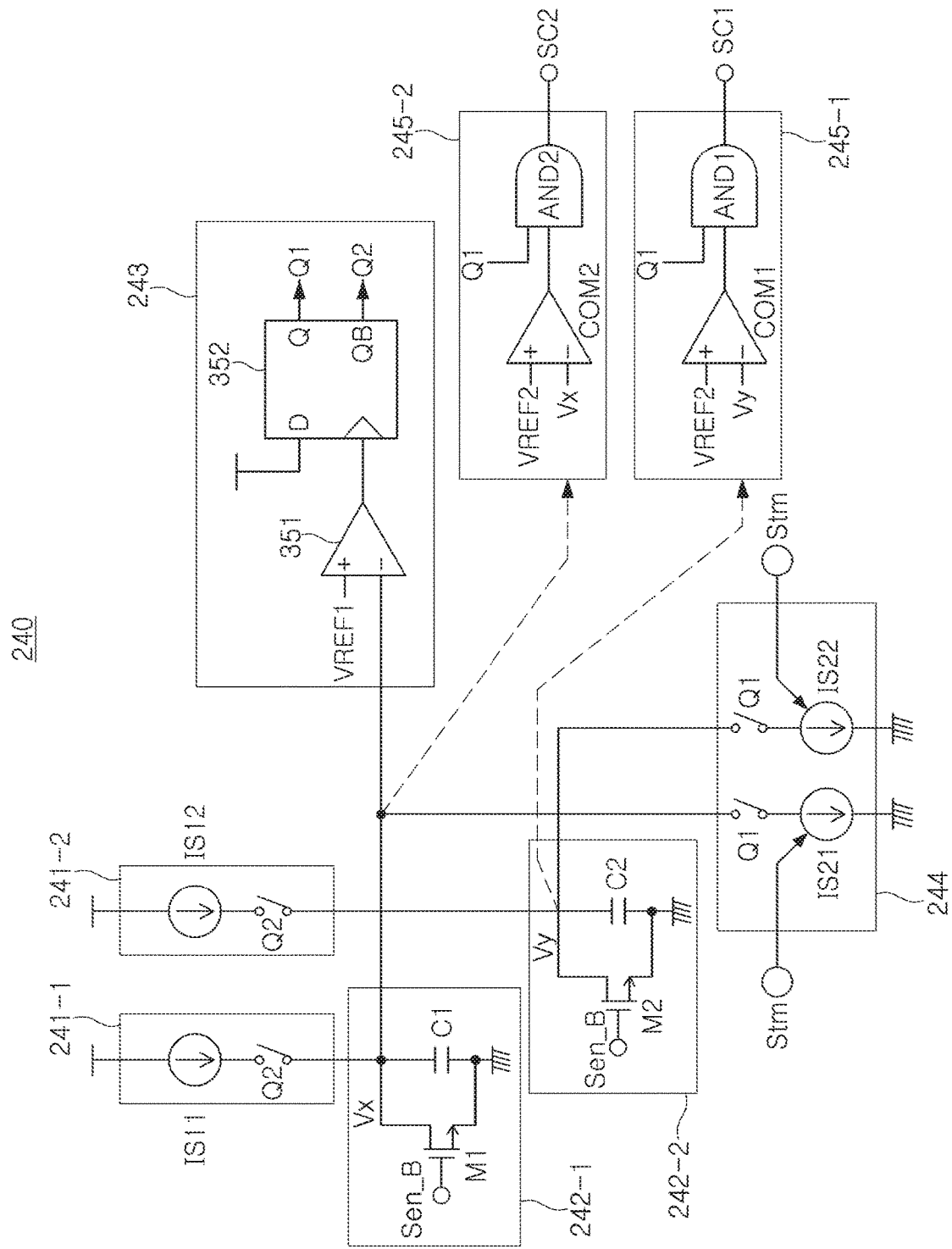
FIG. 15 is an example view of a switching control circuit according to first and second embodiments.
Figure 16:
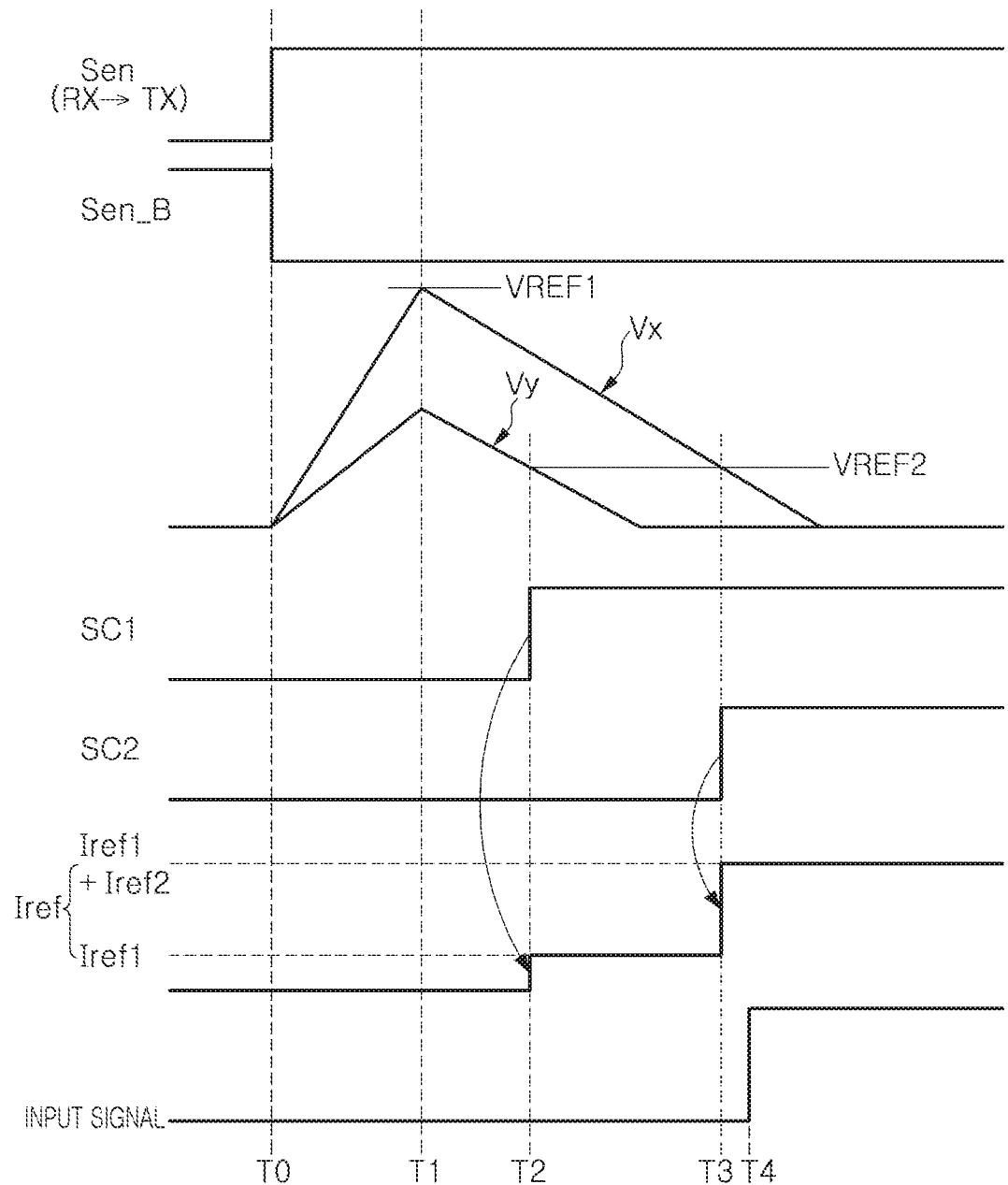
FIG. 16 is an explanatory view of an operation of a bias timing control circuit at a low duty according to first and second embodiments.
Figure 17:
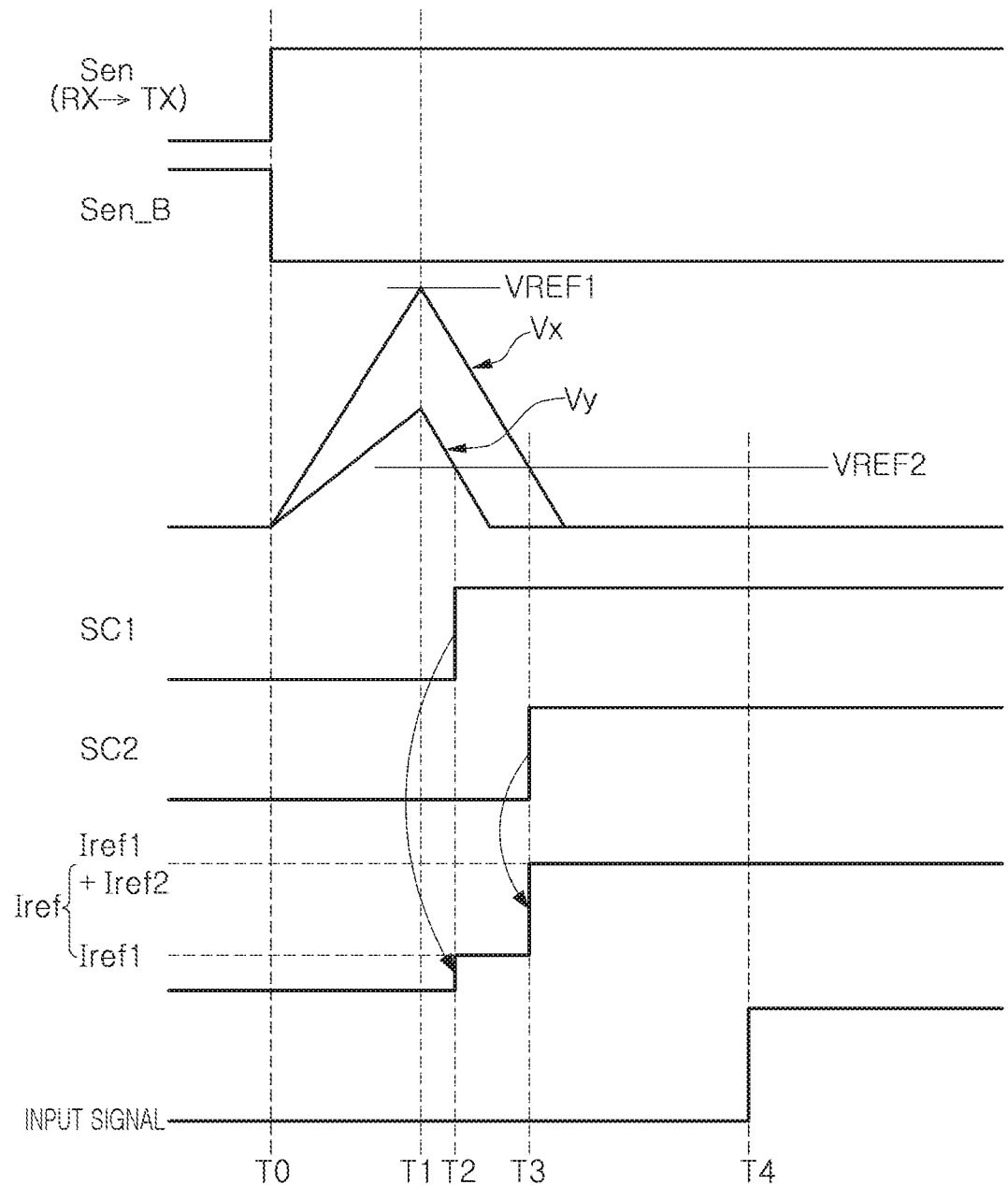
FIG. 17 is an explanatory view of an operation of a bias timing control circuit at a high duty according to first and second embodiments.

The switching control circuit 240 may control magnitudes of charging currents IS11 and IS12 of FIG. 15 or discharging currents IS21 and IS22 of FIG. 15, based on the timing control signal Stm to control a time interval between the first turn-on time of the first path switch SW1 (T2 of FIGS. 16 and 17) and the second turn-on time of the second path switch SW2 (T3 of FIGS. 16 and 17).

For each figure of the present disclosure, possible unnecessary redundant explanations can be omitted for the same reference numerals and components having the same function, and possible differences for each figure can be explained.

Figure 2:
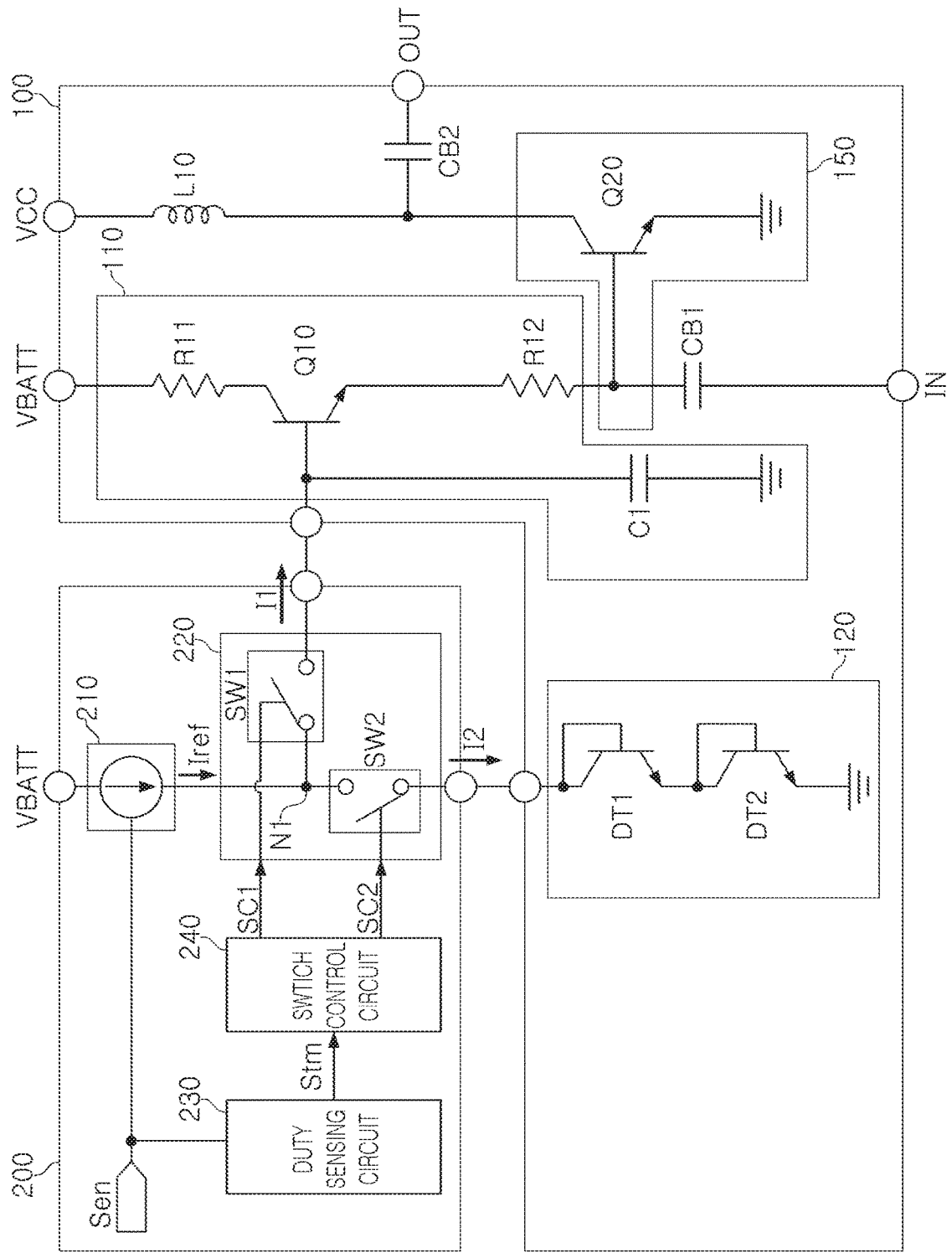
FIG. 2 is an example partial circuit diagram of FIG. 1.

FIG. 2 is a partial circuit diagram of FIG. 1.

When describing an example of a partial circuit with reference to FIG. 2, the bias amplifying circuit 110 may include a transistor Q10 connected between a terminal of a power supply voltage VBATT and the power amplifying circuit 150. The transistor Q10 may include a base connected to the first path switch SW1, a collector connected to the terminal of the power supply voltage VBATT through a resistor R11, and an emitter connected to the power amplifying circuit 150 through a resistor R12. In addition, the bias amplifying circuit 110 may further include a capacitor C1 connected between the base of the transistor Q10 and a ground for stabilizing a base voltage of the transistor Q10.

The temperature compensation circuit 120 may include a first diode-connected transistor DT1 and a second diode-connected transistor DT2, connected between the second path switch SW2 and a ground in series.

The power amplifying circuit 150 may include an amplifying transistor Q20 having a base connected to the emitter of the transistor Q10 of the bias amplifying circuit 110 through the resistor R12, and connected to an input terminal IN through a first direct current blocking capacitor CB1 The power amplifier circuit 150 may further include a collector connected to a terminal of an operating voltage VCC through a coil L10, and connected to an output terminal OUT through a second direct current blocking capacitor CB2. An emitter of the power amplifier circuit 150 may be connected to a ground.

For example, the first diode-connected transistor (DT1) and the second diode-connected transistor (DT2) may have the same temperature characteristics as those of the transistor Q10 of the bias amplifying circuit 110 and the amplifying transistor Q20 of the power amplifying circuit 150. Accordingly, a characteristic drift of the transistor Q10 and the amplifying transistor Q20 based on a temperature change may be compensated.

Figure 3:
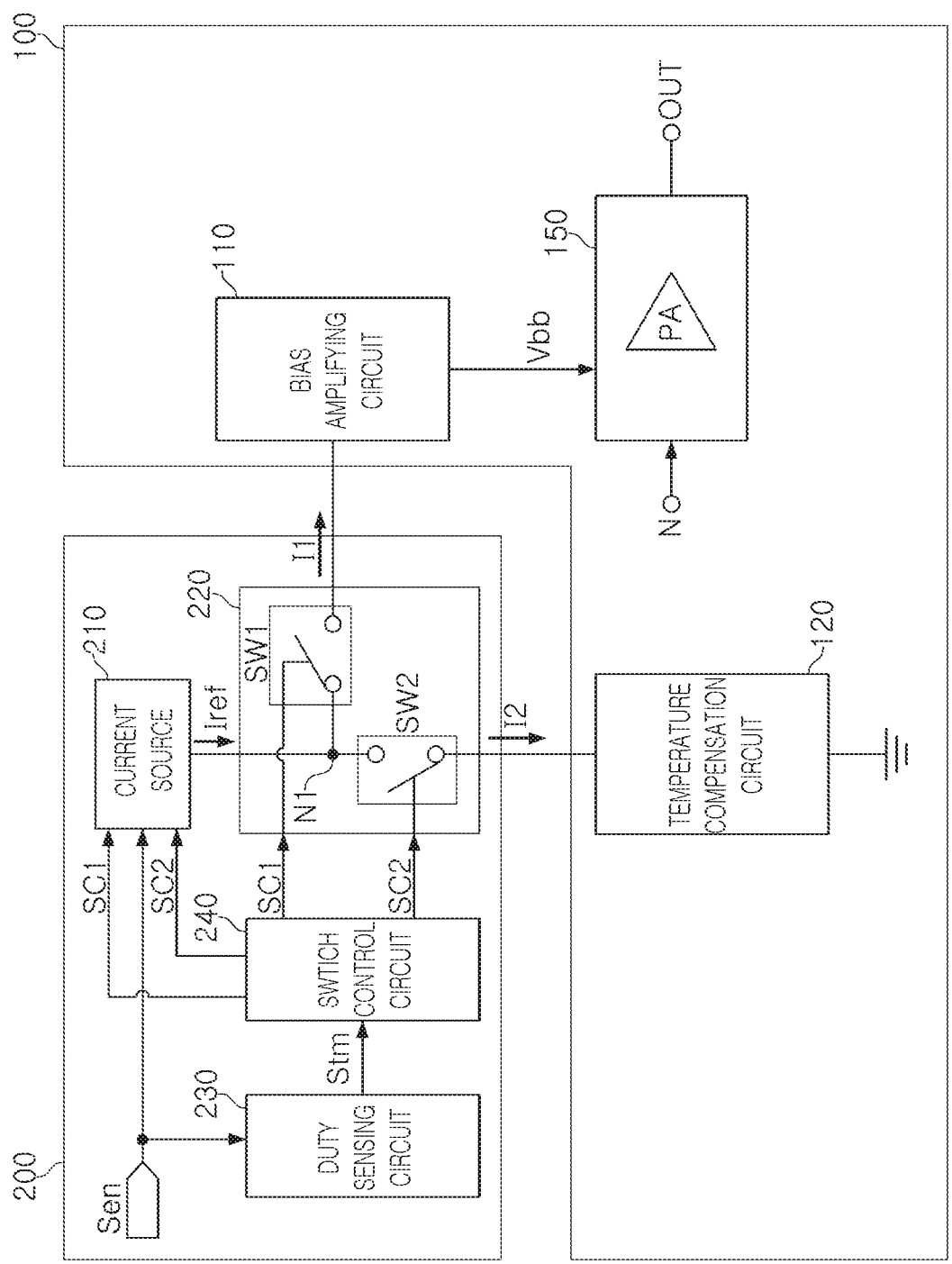
FIG. 3 is an example partial circuit diagram of a bias timing control circuit and an amplifying device according to a second embodiment of the present disclosure.
Figure 4:
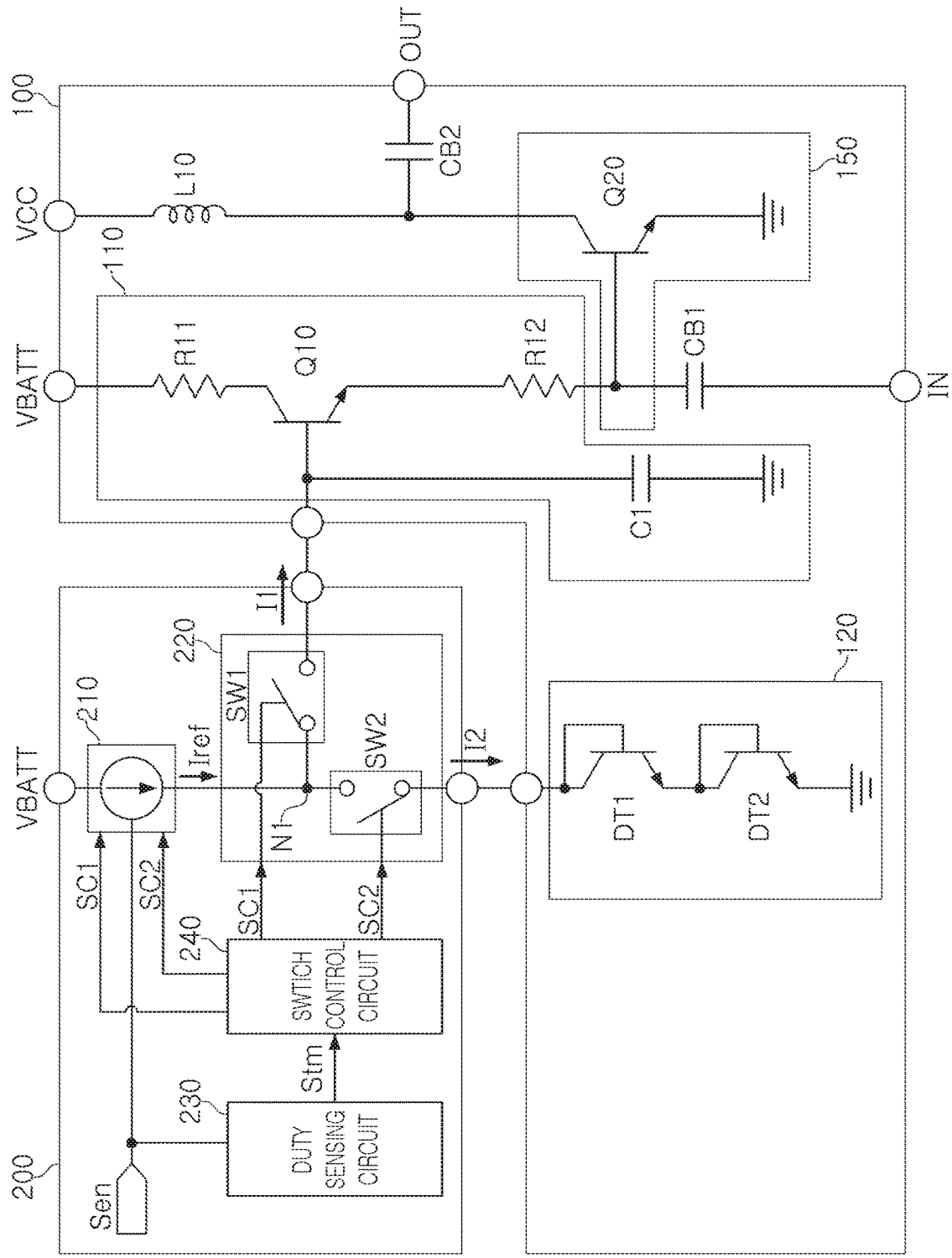
FIG. 4 is an example partial circuit diagram of FIG. 3.

FIG. 3 is a partial circuit diagram of a bias timing control circuit and an amplifying device according to a second embodiment of the present disclosure. FIG. 4 is a partial circuit diagram of FIG. 3.

A difference between the second embodiment shown in FIGS. 3 and 4 and the first embodiment shown in FIGS. 1 and 2 is in the current source 210, and the difference therebetween will be further described with respect to the current source 210 with reference to FIGS. 3 and 4.

For example, the current source 210 may generate a first current Iref1 during the initial startup period to output the first reference Iref1 as a reference current Iref. The current source 210 may generate both a first reference current Iref1 and a second reference current Iref2 during the normal driving period to output a reference current Iref to which the first reference current Iref1 and the second reference current Iref2 are added. Accordingly, the first reference current Iref1 is provided as a first current I1 in the initial driving period, such that the first reference current Iref1 may be smaller than the reference current Iref to which the first reference current Iref1 and the second reference current Iref2 are added.

The current source 210 is not limited to the above-described example. As another example, the current source 210 may generate a first reference current Iref1 during the initial startup period and output the first reference current Iref1 as a reference current Iref. The current source 210 may generate a second reference current Iref2, greater than the first reference current Iref1 and output the second reference current Iref2 as a reference current Iref.

In the following description of the present disclosure, unless otherwise stated, there is provided an example in which the current source 210 outputs the first reference current Iref1 as the reference current Iref during the initial startup period, and the current source 210 outputs the current to which the first reference current Iref1 and the second reference current Iref2 are added as the reference current Iref. The example will be further described below.

As described above, the current generated by the current source 210 during the initial startup period is smaller than the current generated by the current source 210 during the normal driving period because the bias amplifying circuit 110 may be damaged when the bias amplifying circuit 110 receives an excessive amount of current during the initial startup period. Thus, the possibility of damaging the bias amplifying circuit 110 due to excessive current may be prevented in advance.

The bias amplifying circuit 110 may receive, a first current I1 operating in an initial startup period and based on a first reference current Iref1, or a first current I1 operating in a normal driving period and branched from a reference current Iref to which the first and second reference currents Iref1 and Iref2 are added to provide a base bias voltage Vbb to the power amplifying circuit 150.

The temperature compensation circuit 120 may receive a second current I2 operating in the normal driving period and branched from a reference current Iref to which the first and second reference currents Iref1 and Iref2 are added to compensate temperature characteristics of the bias amplifying circuit 110 and the power amplifying circuit 150.

Figure 5:
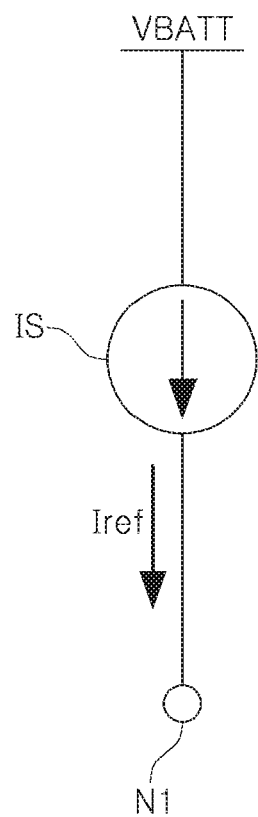
FIG. 5 is an example view of a current source according to a first embodiment.

FIG. 5 is an example view of a current source according to a first embodiment.

Referring to FIG. 5, the current source 210 may include one current source IS to generate a reference current Iref.

Figure 6:
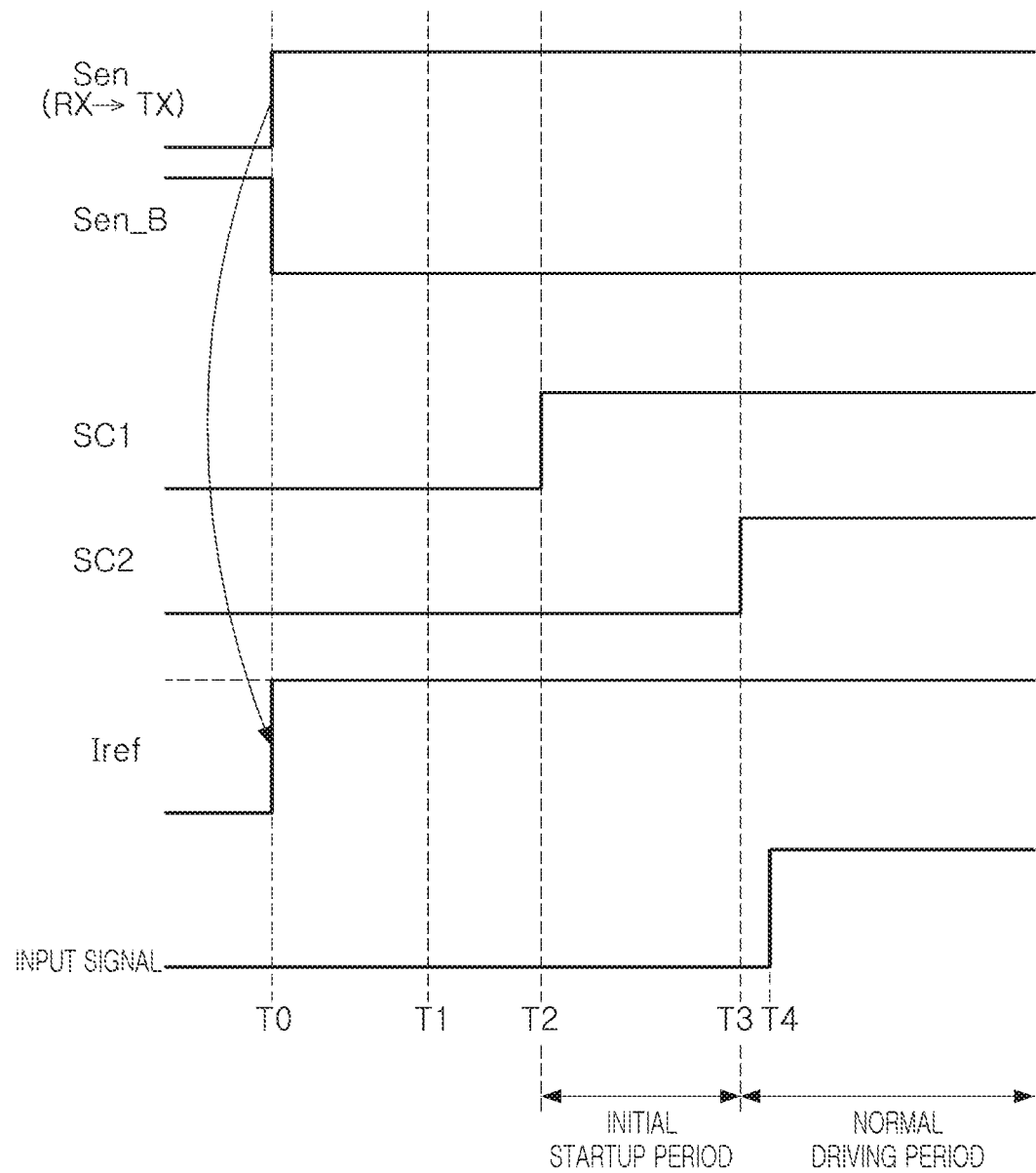
FIG. 6 is an explanatory view of an operation of the bias timing control circuit of FIG. 1.

FIG. 6 is an explanatory view of an operation of the bias timing control circuit of FIG. 1.

Referring to FIG. 6, the bias timing control circuit 200 may receive a transmission enable signal Sen and an inverted transmission enable signal Sen_B. The bias timing control circuit 200 may output a first control signal SC1 having a high level from a start point of the initial startup period and then output a second control signal SC2 having a high level from a start point of the normal driving period.

The current source 210 may output a reference current Iref during the initial startup period and the normal driving period based on the transmission enable signal Sen.

Figure 7:
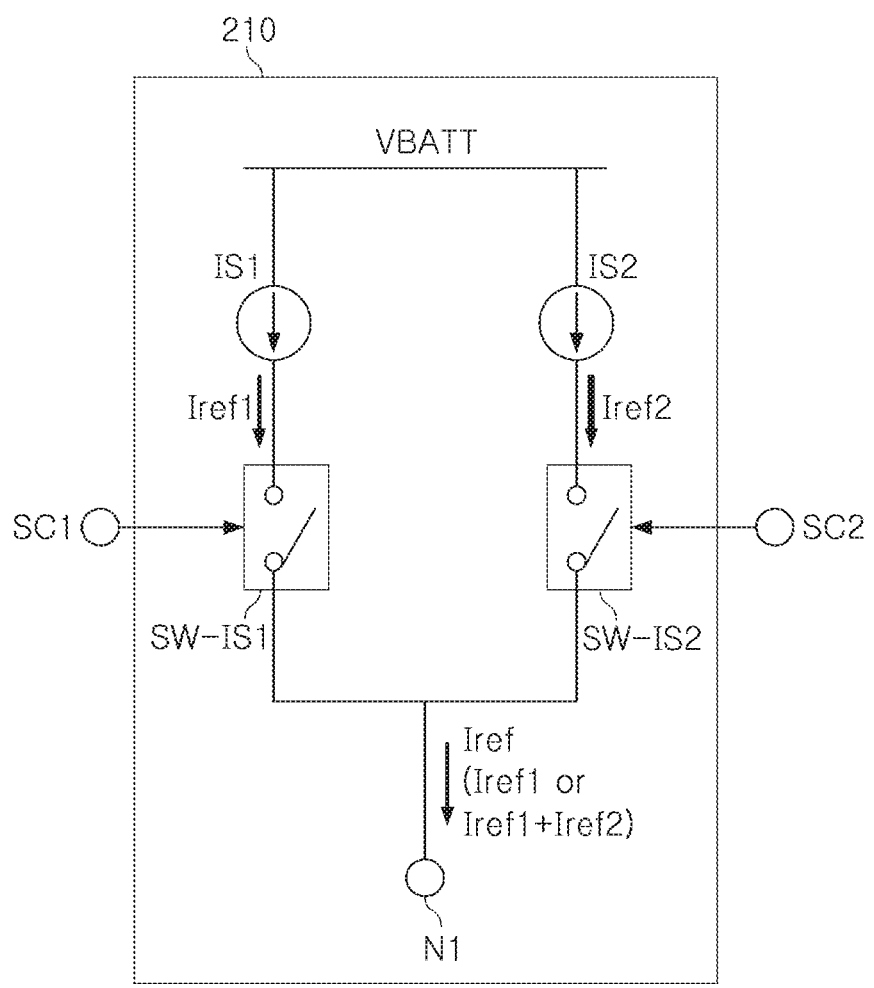
FIG. 7 is an example view of a current source according to a second embodiment.

FIG. 7 is an example view of a current source according to a second embodiment.

Referring to FIG. 7, the current source 210 may include a first current source IS1, a second current source IS2, a first current source switch SW-IS1, and a second current source switch SW-IS2.

The first current source IS1 may be connected between a terminal of the power supply voltage VBATT and the first current source switch SW-IS1 to generate a first reference current Iref1 for being provided during the initial startup period.

The second current source IS2 may be connected between a terminal of the power supply voltage VBATT and the second current source switch SW-IS2 to generate a second reference current Iref2 for being provided during the normal driving period.

The first current source switch SW-IS1 may be connected between the first current source IS1 and an output node N1 of the current source 210 and may be in a turned-on state during the initial startup period, or may be in a turned-on state during the initial startup period and the normal driving period.

The second current source switch SW-IS2 may be connected between the second current source IS2 and the output node N1 of the current source 210, and may be in a turned-on state during the normal driving period.

Figure 8:
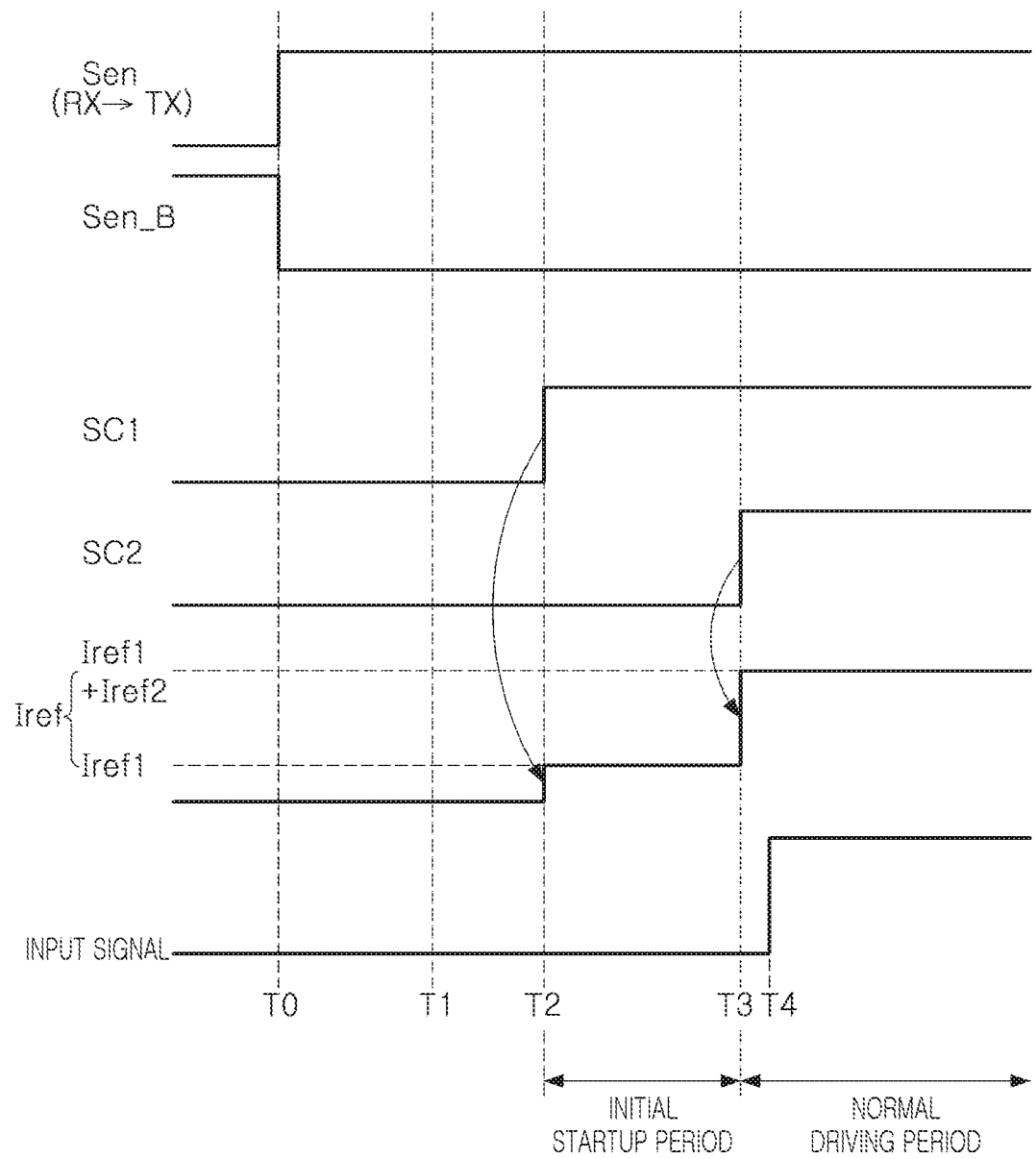
FIG. 8 is an explanatory view of an operation of the bias timing control circuit of FIG. 7.

FIG. 8 is an explanatory view of an operation of the bias timing control circuit of FIG. 7.

Referring to FIG. 8, the bias timing control circuit 200 may output a first control signal SC1 having a high level from a start point or rising edge of the initial startup period, and may output a second control signal SC2 having a high level from a start point or rising edge of the normal driving period.

The current source 210 may output a first reference current Iref1 during the initial startup period, and then may output a reference current Iref to which first and second reference currents Iref1 and Iref2 are added during the normal driving period.

Figure 9:
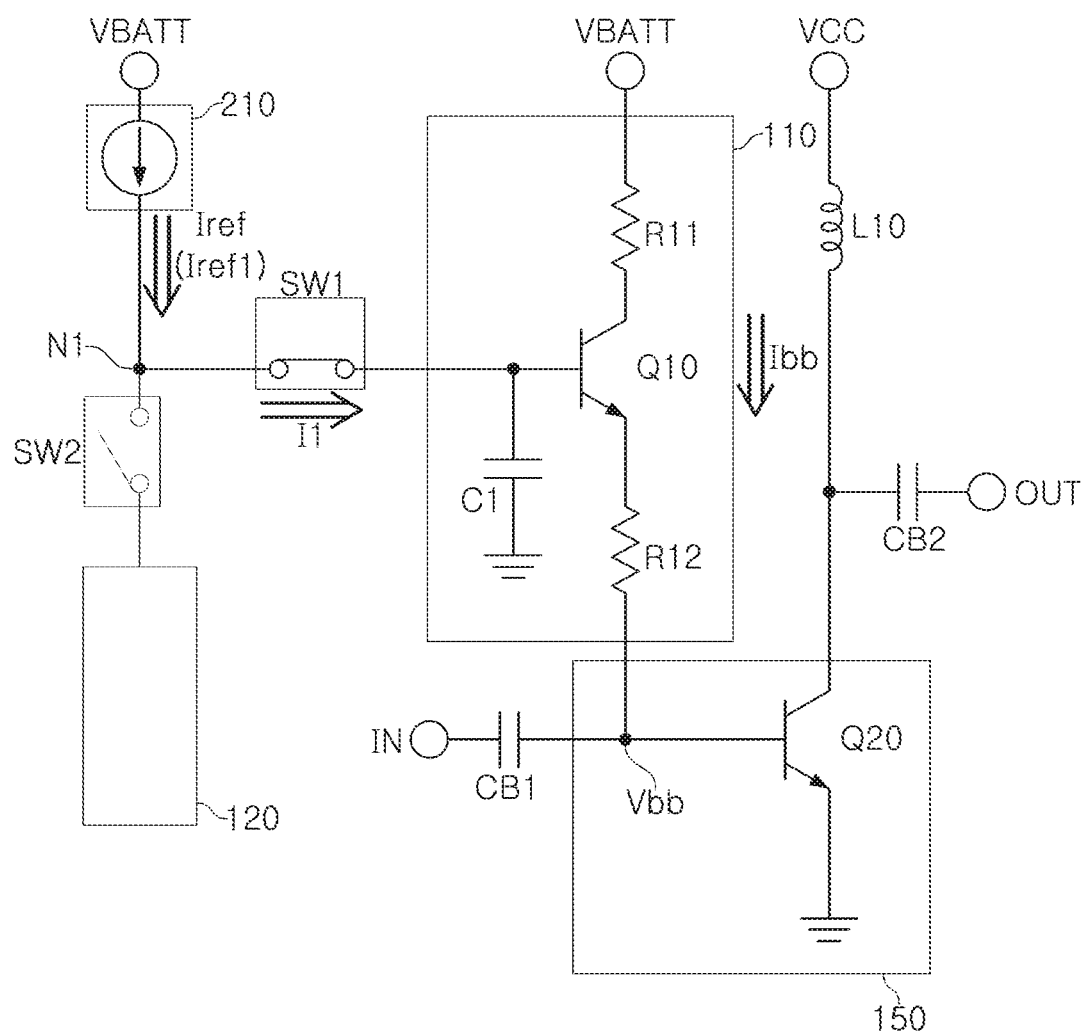
FIG. 9 is an explanatory view of an operation of an amplifying device in an initial startup period according to a second embodiment.

FIG. 9 is an explanatory view of an operation of an amplifying device in an initial startup period according to a second embodiment.

Referring to FIG. 9, a first path switch SW1 of the bias switch circuit 220 may be in a turned-on state responsive to the first control signal SC1, and a second path switch SW2 thereof may be in a turned-off state responsive to the second control signal SC2 in the initial startup period (e.g., T2-T3 in FIG. 16 and FIG. 17).

Accordingly, the first reference current Iref1 of the current source 210 may be supplied to a base of a transistor Q10 of the bias amplifying circuit 110 as a first current I11 through a first path switch SW1, which is in a turned-on state. Since a base bias current Ibb, a collector-emitter current of the transistor Q10, is determined based on the first reference current Iref1, a power amplifier PA of the power amplifying circuit 150 may be rapidly preheated in the initial startup period by the base bias current Ibb, a relatively large current.

Figure 10:
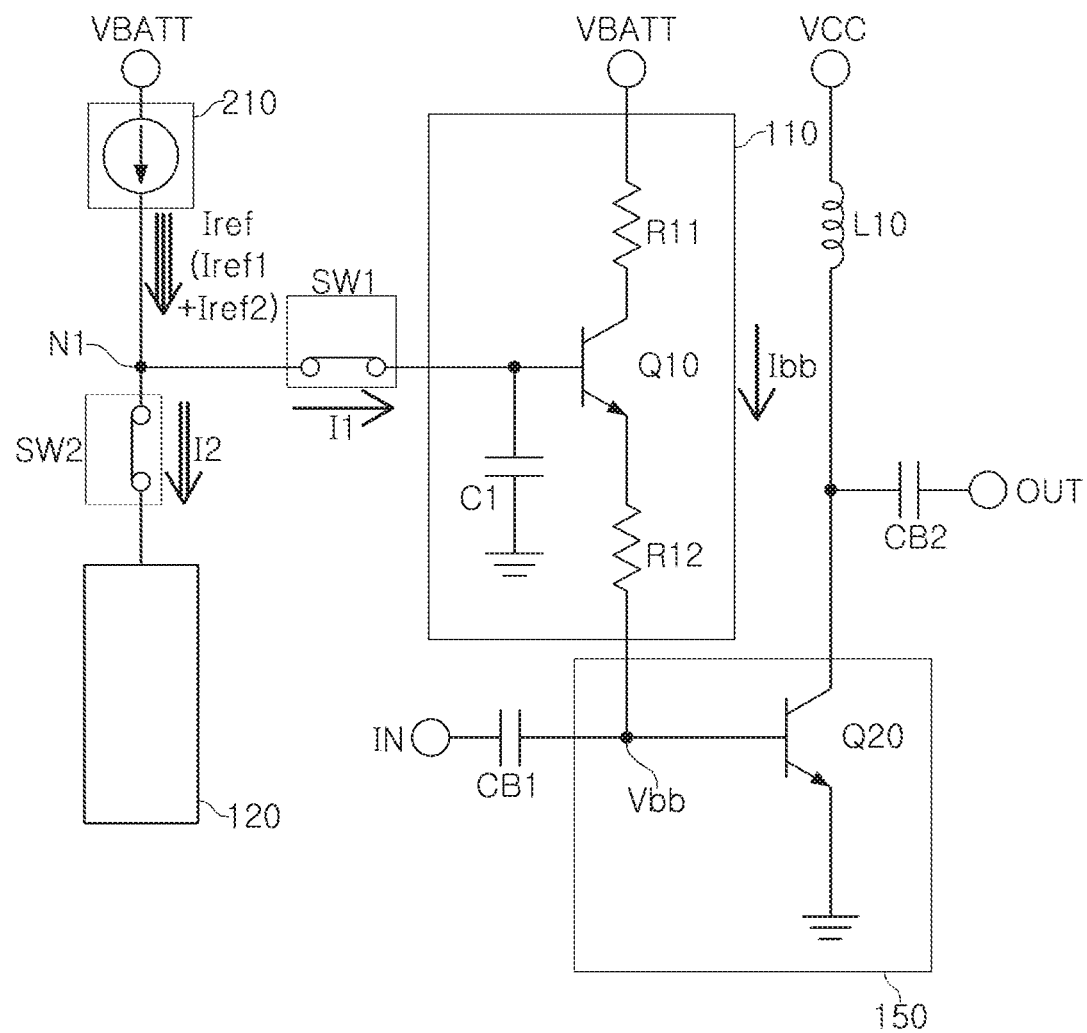
FIG. 10 is an explanatory view of an operation of an amplifying device in a normal driving period according to a second embodiment.

FIG. 10 is an explanatory view of an operation of an amplifying device in a normal driving period according to a second embodiment.

Referring to FIG. 10, in the normal driving period (e.g., after T3 of FIG. 16 and FIG. 17), the first path switch SW1 of the bias switch circuit 220 may be in a turned-on state responsive to a first control signal SC1, and the second path switch SW2 thereof may be in a turned-on state responsive to a second control signal SC2. In this example, since the first control signal SC1 and the second control signal SC2 are both in turned-on states, the current output from the current source 210 may be a reference current Iref, a sum of the first reference current Iref1 and the second reference current Iref2.

Accordingly, the first current I1 branched from the reference current Iref of the current source 210 may be supplied to the base of the transistor Q10 of the bias amplifying circuit 110 through the first path switch SW1, which is in a turned-on state, and the second current I2 branched from the reference current Iref may be supplied to the temperature compensation circuit 120 through the second path switch 12, which is in a turned-on state.

In the normal driving period, the first current I1 branched from the reference current Iref is smaller than the first reference current Iref1. Since the base bias current Ibb, the collector-emitter current of the transistor Q10 is determined based on the first current I1, smaller than the first reference current Iref1, the power amplifier PA of the power amplifying circuit 150 may operate a normal operation in the normal driving period by the base bias current Ibb, a relatively small current.

In FIGS. 9 and 10, CB1 is a DC blocking input capacitor, CB2 is a DC blocking output capacitor, R11 and R12 are bias resistors of the bias amplifying circuit 110, C1 is an internal capacitor of the bias amplifying circuit 110, and L10 is an inductor connected to a terminal of an operating voltage VCC.

Figure 11:
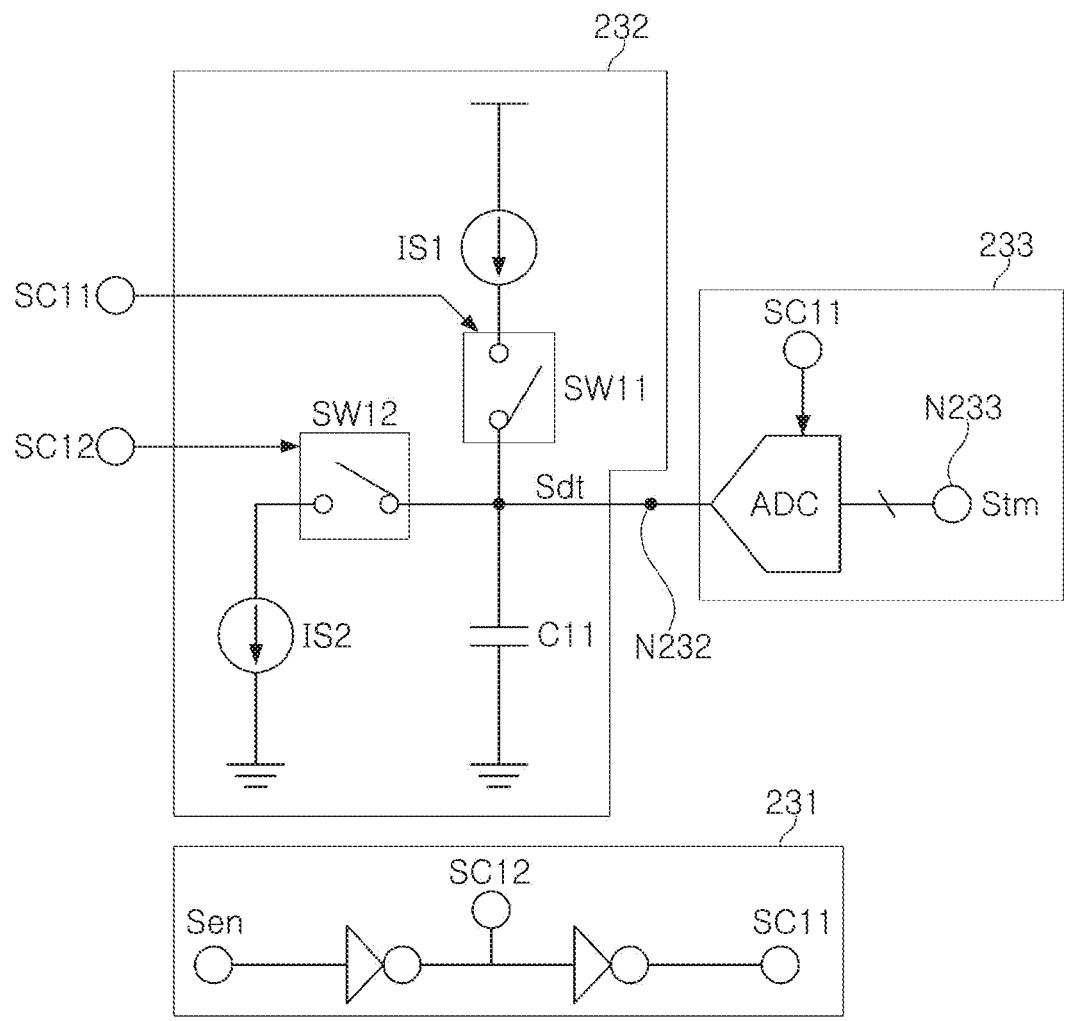
FIG. 11 is an example view of a duty cycle sensing circuit according to first and second embodiments.
Figure 12:
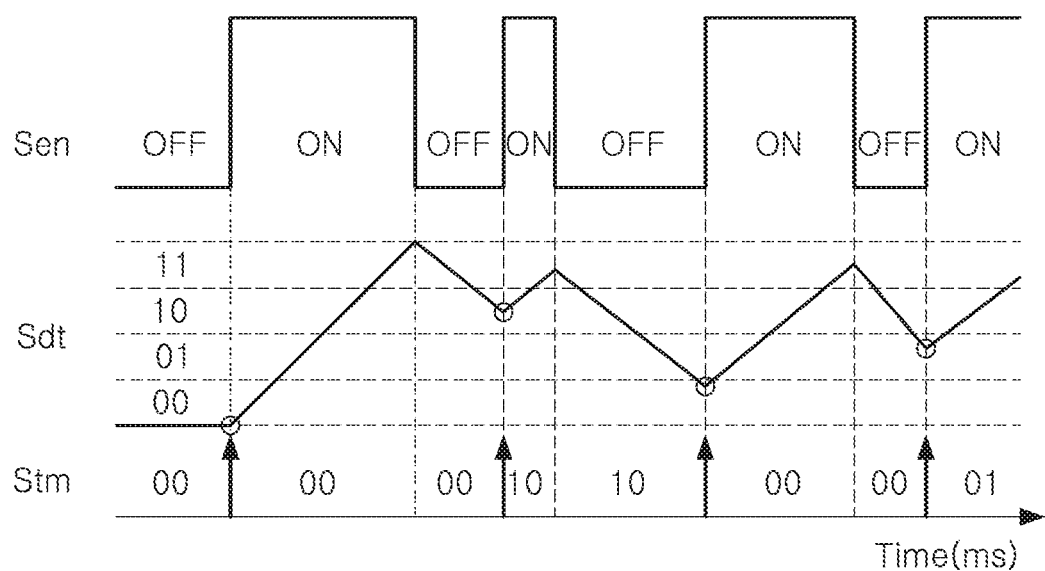
FIG. 12 is an example view of a main signal of the duty cycle sensing circuit of FIG. 11.

FIG. 11 is an example view of a duty cycle sensing circuit according to first and second embodiments, and FIG. 12 is an example view of a main signal of a duty cycle sensing signal.

Referring to FIGS. 11 and 12, the duty cycle sensing circuit 230 may include a signal detection circuit 231, a duty cycle signal generating circuit 232, and an A/D converter 233 generating a timing control signal Stm having a code value corresponding to a voltage magnitude of a duty cycle signal Sdt.

The signal detection circuit 231 may generate a first switch signal SC11 synchronized with the transmission enable signal Sen and a second switch signal SC12 in an inverted relationship with the first switch signal SC11. For example, the signal detection circuit 231 may generate a second switch signal SC12 by inverting the transmission enable signal Sen through one inverter, and may generate a first switch signal SC11 by switching the second switch signal SC12 through the other converter.

The duty cycle signal generating circuit 232 may perform a charging operation based on the first switch signal SC11 and may perform a discharging operation based on the second switch signal SC12 to generate a duty cycle signal Sdt. For example, the duty cycle signal generating circuit 232 may include a first switch SW11 and a capacitor C11 connected between a terminal of a first current source IS1 and a ground and a second switch SW12 in series and a second current source IS2 connected between a connection node between the first switch SW11 and the capacitor C11 and a ground in series. When the first switch SW11 is in a turned-on state by the first switch signal SC11 and the second switch SW12 is in a turned-off state by the second switch signal SC12, charge-charging may be performed on the capacitor C11 based on the current from the first current source IS1 provided through the first switch SW11. In addition, when the first switch SW11 is in a turned-off state by the first switch signal SC11 and the second switch SW12 is in an on state, charge-discharging may be performed based on the current of the second current source IS2 from the capacitor C11 to a ground.

The A/D converter 233 may output the timing control signal Stm having a code value corresponding to a voltage magnitude of the duty cycle signal Sdt input through an output node N232 of the duty cycle signal generating circuit 232 through an output node N233.

Referring to FIG. 12, a transmission enable signal Sen may transition to a high level at a time of switching from a reception mode to a transmission mode in an applied system.

A duty cycle signal Sdt output from the duty cycle signal generating circuit 232 shown in FIG. 11 has a voltage level linearly increasing while the duty cycle signal generating circuit 232 performs a charging operation, and has a voltage level linearly decreasing while the duty cycle signal generating circuit 232 performs a discharging operation.

Stm is a timing control signal generated in the duty cycle sensing circuit 230, and the timing control signal Stm may include a code value corresponding to a voltage level (=voltage magnitude) of the duty cycle signal Sdt at each rising edge point of the transmission enable signal Sen.

Figure 13:
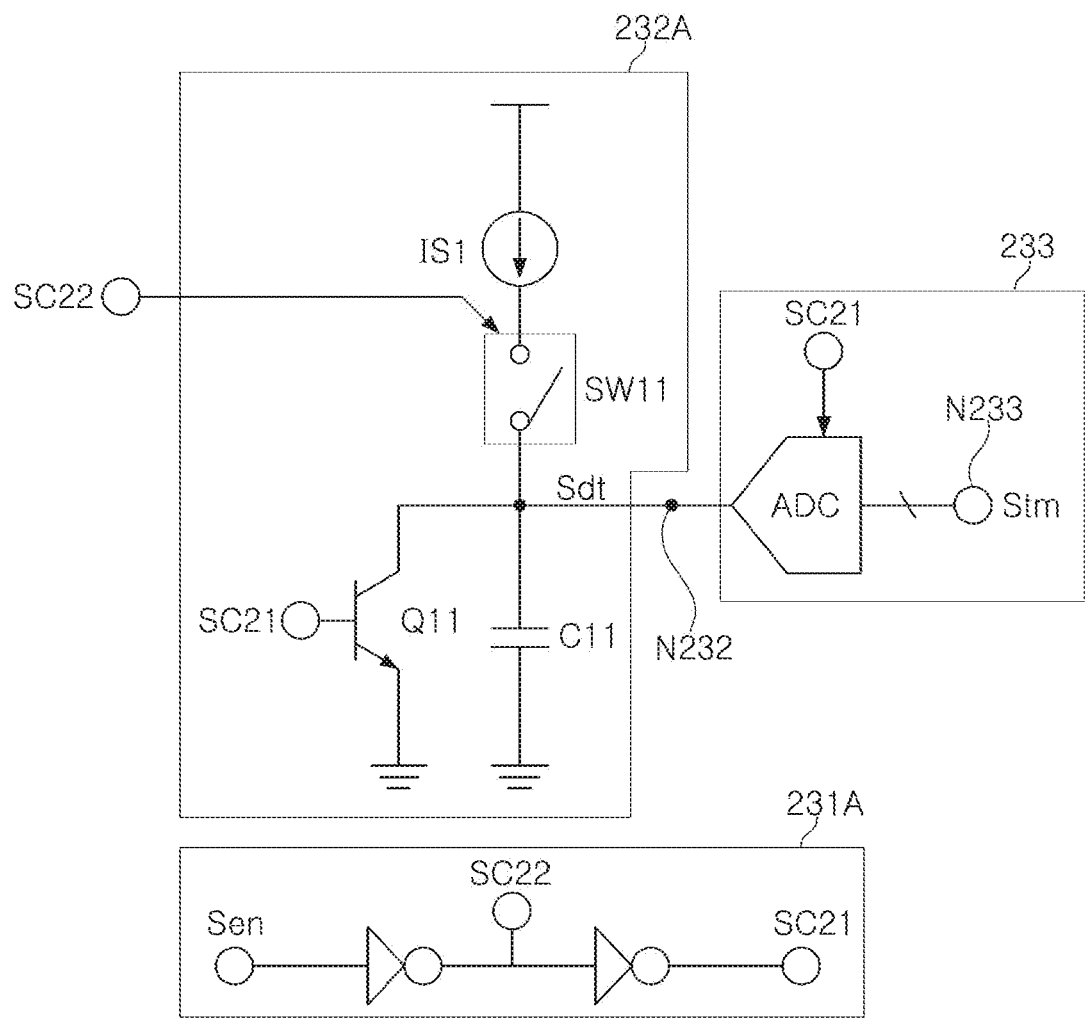
FIG. 13 is another example view of the duty cycle sensing circuit according to first and second embodiments.
Figure 14:
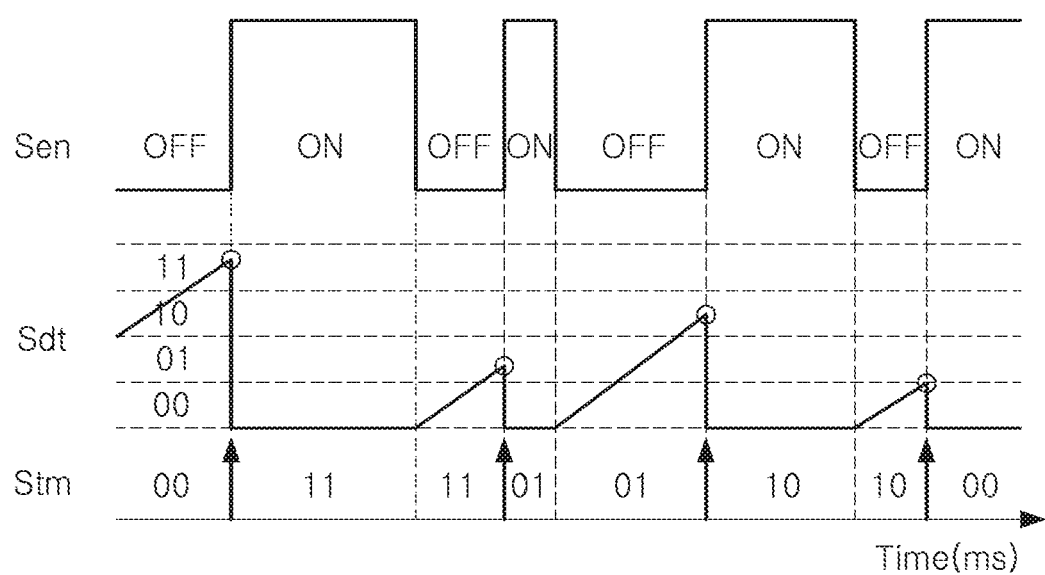
FIG. 14 is an example view of a main signal of the duty cycle sensing circuit of FIG. 13.

FIG. 13 is another example view of a duty cycle sensing circuit according to a second embodiment, and FIG. 14 is an example view of a main signal of the duty cycle sensing circuit of FIG. 13.

Referring to FIGS. 13 and 14, the duty cycle sensing circuit 230 may include a signal detection circuit 231A, a duty cycle signal generating circuit 232A, and an A/D converter 233.

The signal detection circuit 231A may generate a first switch signal SC21 synchronized with the transmission enable signal Sen and a second switch signal SC22 in an inverted relationship with the first switch signal SC21. For example, the signal detection circuit 231A may generate the second switch signal SC22 by inverting the transmission enable signal Sen through one inverter, and may generate the first switch signal SC21 by inverting the second switch signal SC22 through the other inverter.

The duty cycle signal generating circuit 232A may perform a charging operation based on the second switch signal SC22, and may perform a discharging operation based on the first switch signal SC21 to generate a duty cycle signal Sdt. For example, the duty cycle signal generating circuit 232A may include a first switch SW11 connected between a terminal of the first current source IS1 and a ground C11 in series and a switch transistor Q11 connected between a connection node between the first switch SW11 and the capacitor C11 and a ground in series. When the first switch SW11 is in a turned-on state responsive to the second switch signal SC22 and the switch transistor Q11 is in a turned-off state responsive to the first switch signal SC21, charge-charging may be performed on the capacitor C11 based on the current from the first current source IS1 provided through the first switch SW11. In addition, when the first switch SW11 is in a turned-off state responsive to the second switch signal SC22 and the switch transistor Q11 is in a turned-on state responsive to the first switch signal SC21, charge-discharging may be performed from the capacitor C11 to a ground through the switch transistor Q11.

The A/D converter 233 may output the timing control signal Stm having a code value corresponding to a voltage magnitude of the duty cycle signal Sdt input through an output node N232 of the duty cycle signal generating circuit 232 through an output node N233.

Referring to FIG. 14, a transmission enable signal Sen may be transition to a high level at a time of switching from a reception mode to a transmission mode in an applied system.

A duty cycle signal Sdt output from the duty cycle signal generating circuit 232A shown in FIG. 13 has a voltage level, linearly increasing while the duty cycle signal generating circuit 232A performs a charging operation. The duty cycle signal Sdt falls to a low level when the duty cycle signal generating circuit 232 starts to perform a discharging operation and is maintained continuously at a low level while the duty cycle signal generating circuit 232 performs a discharging operation.

Stm is a timing control signal generated by the duty cycle sensing circuit 230 and the timing control signal Stm includes a code value corresponding to a peak voltage level (=voltage magnitude) of the duty cycle signal Sdt at each rising edge point of the transmission enable signal Sen.

In FIGS. 12 and 14, when a timing control signal Stm is a signal having a code value of 2 bits, the code value has a code value of '00', '01', '10', and '11'.

FIG. 15 is an example view of a switching control circuit according to first and second embodiments. FIG. 16 is an explanatory view of an operation of a bias timing control circuit at a low duty according to first and second embodiments. FIG. 17 is an explanatory view of an operation of a bias timing control circuit at a high duty according to first and second embodiments.

Referring to FIG. 15, the switching control circuit 240 may include a first constant circuit 241-1, a second constant circuit 242-1, a first capacitor circuit 242-1, a second capacitor circuit 242-2, a discharge control circuit 243, a discharge circuit 244, a first comparison circuit 245-1, and a second comparison circuit 245-2.

The first constant current source 241-1 may be in a switched-on state or be in a switched-off state in response to a Q2 signal, and may generate a first constant current IS11 and output the first constant current IS11 in the switched-on state.

The second constant current source 241-2 may be in a switched-on state or in a switched-off state in response to the Q2 signal and may generate a second constant current IS12 and output the second constant current IS12 in the switched-on state.

For example, the first constant current IS11 may be larger than the second constant current IS12. Accordingly, referring to FIGS. 16 and 17, a slope (a slope of a first charging voltage Vx between T0 and T1) of the first charging voltage Vx of the first capacitor circuit 242-1 may be greater than a slope (a slope of a second charging voltage Vy between T0 and T1) of the second charging voltage Vy of the first capacitor circuit 242-1.

The first capacitor circuit 242-1 may include a first capacitor C1 and a first switch element M1 connected in parallel, and the first capacitor C1 may perform charge-charging based on the first constant current IS11 to output a first charging voltage Vx. The first switch element M1 may be in an off state in a system enable state in response to an inverted transmission enable signal Sen_B and may be in an on state in a system disable state to discharge a first charging voltage Vx charged in the first capacitor C1.

The second capacitor circuit 242-2 may include a second capacitor C2 and a second switch element M2 connected in parallel. The second capacitor C2 may perform charge-charging based on the second constant current IS12 to output a second charging voltage Vy. In response to the inverted transmission enable signal Sen_B, the second switch element M2 may be in an off state in a system enable state and may be in an on state in a system disable state, such that the second charging voltage Vy charged in the second capacitor C2 may be discharged.

The discharge control circuit 243 may compare the first charging voltage Vx with a first reference voltage VREF1 and output a Q1 signal and a Q2 signal having a level according to the comparison result to control output cut-off and discharging of the first and second constant current sources 241-1 and 241-2. For example, the discharging control circuit 243 may include a comparator 351 and a latch 352. The comparator 351 may compare the first charging voltage Vx with a first reference voltage VREF1 and output a signal having a low level when the first charging voltage Vx is lower than the first reference voltage VREF1, and output a signal having a high level when the first charging voltage Vx is higher than the first reference voltage VREF1. The latch 352 may output a Q1 signal having a low level and a Q2 signal having a high level, when a signal input to a clock terminal has a low level, and may output a Q1 signal and having a high level and a Q2 signal having a low level, when a signal inputted to a clock terminal has a high level.

The discharging circuit 244 may perform discharging of each of the first capacitor circuit 242-1 and the second capacitor circuit 242-2 in response to a control of the discharging control circuit 243. For example, the discharging circuit 244 causes the third constant current IS21 to flow to a ground in response to the Q1 signal, to discharge the first charging voltage Vx of the first capacitor circuit 242-1, and causes the fourth constant current IS22 in response to the Q1 signal, to charge the second charging voltage Vy of the second capacitor circuit 242-2.

For example, when the Q2 signal has a high level, a charging operation may be performed in the first capacitor circuit 242-1 and the second capacitor circuit 242-2, and when the Q1 signal has a high level, a discharging operation may be performed in the first capacitor circuit 242-1 and the second capacitor circuit 242-2 by the discharging circuit 244, which is in on state.

The first comparison circuit 245-1 may compare the second charging voltage Vy with a second reference voltage VREF2 to output a first control signal SC1 including a level according to the comparison result.

For example, the first comparison circuit 245-1 may include a first comparator COM1 and a first AND gate AND1. The first comparator COM1 may compare the second charging voltage Vy with a second reference voltage VREF2 and output a signal including a low level, when the second charging voltage Vy is higher than the second reference voltage VREF2 and a signal including a high level, when the second charging voltage Vy is lower than the second reference voltage VREF2 to the first AND gate AND1.

The first AND gate AND1 may logically multiply the Q1 signal and the output signal of the first comparator COM1 to output a first control signal SC1 having a high level when both signals all have a high level.

The second comparison circuit 245-2 may compare the first charging voltage Vx with the second reference voltage VREF2 to output a second control signal SC2 including a level according to the comparison result.

For example, the second comparison circuit 245-2 may include a second comparator COM2 and a second AND gate AND2. The second comparator COM2 may compare the first charging voltage Vx with the second reference voltage VREF2 and output a signal including a low level, when the first charging voltage Vx is higher than the second reference voltage VREF2 and including a high level, when the first charging voltage Vx is lower than the second reference voltage VREF2.

The second AND gate AND2 may logically multiply the Q1 signal and the output signal of the second comparator COM2 to output the second control signal SC2 having a high level when both signals have a high level.

Referring to FIGS. 16 and 17, when a first charging voltage Vx or a second charging voltage Vy charged at the point T0 at which the transmission enable signal Sen high-transitions reaches a first reference voltage VREF1 (T1). The Q2 signal may be a signal having an off-level and the Q1 signal may be a signal having an on-level, such that the charge charged in the first capacitor C1 and the second capacitor C2 may be discharged at a constant rate.

Through the discharging operation, each of the first control signal SC1 and the second control signal SC2 transition to a rising level at the point at which each of the first charging voltage Vx or the second charging voltage Vy is equal to the second reference voltage VREF2 (T1 and T2). That is, the first control signal SC1 is in an on level at the time T2 at which the second charging voltage Vy becomes equal to the second reference voltage VREF2, the second control signal SC2 is in an on level at the time at which the first charging voltage Vx becomes equal to the second reference voltage VREF2. As a result, the power amplifying device may be preheated (warmed-up) during the time between the point T2 at which the first control signal SC1 is in an on level and the time T3 when the second control signal SC2 is in an on level T3.

As described above, referring to FIGS. 16 and 17, the bias timing control circuit 20 may output a first control circuit SC1 having a high level from a start point of the initial startup period, and then output a second control signal SC2 having a high level from a start point of the normal driving period. Accordingly, the current source 210 may output the first reference current Iref1 during the initial startup period, and then output a reference current Iref, greater than the first reference current Iref1 (the first current+the second current) during the normal driving period. For example, the switching control circuit 240 may control the first path switch SW1 to be in a turned-on state, based on the transmission enable signal Sen, in the initial startup period T2-T3, and control the second path switch SW2 to be in a turned-off state, and may control both first path switch SW1 and the second path switch SW2 to be in turned-on states, in the normal driving period (after T3).

The first path switch SW1 may supply the first reference current Iref1 as the first current I1 to the bias amplifying circuit 110 in the initial startup period T2-T3, and may supply the first current I1 branched from the reference current Iref to the bias amplifying circuit 110 in the normal driving period (after T3).

The second path switch SW2 may supply the second current I2 branched from the reference current Iref to the temperature compensation circuit 120 in the normal driving period (after T3). The second current I2 in the normal driving period (after T3) may be larger than the first current I1 in the normal driving period (after T3).

In particular, the first and second constant currents IS11 and IS12 or the third and fourth constant currents IS21 and IS22 may be adjusted responsive to the timing control signal Stm of FIG. 12 or the timing control signal Stm of FIG. 14.

In addition, FIG. 15 illustrates that the third and fourth constant currents IS21 and IS22 are adjusted, but is not limited thereto, and a method of adjusting the first and second constant currents IS11 and IS12 may also be applied.

For example, referring to FIGS. 15 and 16, the third constant current IS21 and the fourth constant current IS22 may have a relatively gradual discharging gradient as illustrated in FIG. 16, responsive to the timing control signal Stm of FIGS. 12 and 13 having a code value corresponding to a low duty cycle of the transmission enable signal Sen. The first charging voltage Vx and the second charging voltage Vy will decrease relatively slowly, as compared to the corresponding charging voltage illustrated in FIG. 17.

As another example, referring to FIGS. 15 and 17, the third constant current IS21 and the fourth constant current IS22 may have a relatively steep discharging gradient as illustrated in FIG. 17, responsive to the timing control signal Stm of FIGS. 12 and 14 having a code value corresponding to a high duty cycle of the transmission enable signal Sen, and the first charging voltage Vx and the second charging voltage Vy will decrease relatively quickly, as compared to the corresponding charging voltage illustrated in FIG. 16.

In FIGS. 16 and 17, Sen is a system transmission enable signal, and may be transitioned from a low level to a high level, for example, upon changing from a reception RX mode to a transmission TX mode. T0 is a transmission enable point, T1 is a discharging point determined by the Q1 signal of the discharging control circuit 243, T2 is a rising point of the first control signal SC1 determined according to an output signal of the first comparison circuit 245-1, T3 is a rising point of the second control signal SC2 determined according to an output signal of the second comparison circuit 245-2, and T4 is a point at which the signal is input through the input terminal of the power amplifying circuit 150.

As set forth above, according to an embodiment of the present disclosure, a bias timing, that is, an initial startup time and a normal operation time, based on a duty cycle of a transmission enable signal, may be controlled. Accordingly, a preheating (warming) time may be adjusted based on the duty cycle of the transmission enable signal to reduce degradation in the linearity performance of a power amplifier based on a rapid temperature change.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bias timing control circuit, comprising:
   a current source configured to generate a reference current;
   a bias switch circuit comprising a first path switch, connected between an output node of the current source and a bias amplifying circuit, and a second path switch, connected between the output node of the current source and a temperature compensation circuit;
   a duty cycle sensing circuit configured to generate a timing control signal based on a duty cycle of a transmission enable signal; and
   a switching control circuit, based on the timing control signal, configured to
      control the first path switch to be in a turned-on state during an initial startup period and a normal driving period, subsequent to the initial startup period, to adjust a warm-up time of a power amplifying circuit,
      control the second path switch to be in a turned-off state during the initial startup period, and
      control the second path switch to be in the turned-on state during the normal driving period.

2. The bias timing control circuit of claim 1, wherein the timing control signal has a code value corresponding to the duty cycle of the transmission enable signal.

3. The bias timing control circuit of claim 1, wherein the switching control circuit is further configured to control a time interval between a first turn-on time of the first path switch and a second turn-on time of the second path switch by controlling a magnitude of a charging or discharging current based on the timing control signal.

4. A bias timing control circuit, comprising:
   a current source configured to generate a reference current;
   a bias switch circuit comprising a first path switch, connected between an output node of the current source and a bias amplifying circuit, and a second path switch, connected between the output node of the current source and a temperature compensation circuit;
   a duty cycle sensing circuit configured to generate a timing control signal based on a duty cycle of a transmission enable signal; and
   a switching control circuit configured to control a first turn-on time of the first path switch during an initial startup period, and a second turn-on time of the second path switch during a normal driving period subsequent to the initial startup period to adjust a warm-up time of a power amplifying circuit based on the timing control signal,
   wherein the duty cycle sensing circuit comprises:
      a signal detection circuit configured to generate a first switch signal synchronized with the transmission enable signal and a second switch signal in an inverted relationship with the first switch signal;
      a duty cycle signal generating circuit configured to perform a charging operation based on the first switch signal and a discharging operation based on the second switch signal to generate a duty cycle signal; and
      an A/D converter configured to generate the timing control signal having a code value corresponding to a voltage magnitude of the duty cycle signal.

5. The bias timing control circuit of claim 1, wherein the duty cycle sensing circuit comprises:
   a signal detection circuit configured to generate a first switch signal synchronized with the transmission enable signal and a second switch signal in an inverted relationship with the first switch signal;
   a duty cycle signal generating circuit configured to perform a charging operation based on the second switch signal and a discharging operation based on the first switch signal; and
   an A/D converter configured to generate the timing control signal having a code value corresponding to a voltage magnitude of the duty cycle signal.

6. The bias timing control circuit of claim 1, wherein the switching control circuit comprises:
- a first constant current source configured to generate a first constant current;
- a second constant current source configured to generate a second constant current;
- a first capacitor circuit configured to perform a charge-charging based on the first constant current to output a first charging voltage;
- a second capacitor circuit configured to perform the charge-charging based on the second constant current to output a second charging voltage;
- a discharging control circuit configured to compare the first charging voltage with a first reference voltage and control output cutoff and discharging of the first and second constant current sources including a level according to the comparison result;
- a discharging circuit configured to discharge each of the first capacitor circuit and the second capacitor circuit in response to the control of the discharging control circuit;
- a first comparison circuit configured to compare the second charging voltage with a second reference voltage to output a first control signal including a level according to the comparison result; and
- a second comparison circuit configured to compare the first charging voltage with a second reference voltage to output a second control signal including a level according to the comparison result.

7. The bias timing control circuit of claim 1, wherein the switching control circuit is further configured to
- control the first path switch to be in a turned-on state and the second path switch to be in a turned-off state in the initial startup period, based on the transmission enable signal, and
- control both the first path switch and the second path switch to be in the turned-on state in the normal driving period.

8. The bias timing control circuit of claim 7, wherein the current source is further configured to
- generate a first reference current during the initial startup period and output the first reference current as a reference current, and
- generate an added combination of the first reference current and a second reference current during the normal driving period as the reference current,
- wherein the first path switch is configured to
- supply the first reference current to the bias amplifying circuit as the first current in the initial startup period, and
- supply the added combination of the reference current and the second reference current to the bias amplifying circuit in the normal driving period,
- wherein the second path switch is configured to
- supply the added combination of the first reference current and the second reference current to the temperature compensation circuit in the normal driving period,
- wherein the bias amplifying circuit is configured to
- receive the first current based on the first reference current during the initial startup period or branched from the reference current of the added combination of the first reference current and the second reference current during the normal driving period to provide a base bias voltage to the power amplifying circuit, and
- wherein the temperature compensation circuit is configured to
- receive the added combination of the first reference current and the second reference current during the normal driving period to compensate temperature characteristics of the bias amplifying circuit and the power amplifying circuit, the second current in the normal driving period being greater than the first current in the normal driving period.

9. An amplifying device, comprising:
- a current source configured to generate a reference current;
- a power amplifying circuit connected between an input terminal and an output terminal;
- a bias amplifying circuit configured to, receive a first current based on the reference current to provide a base bias voltage, to the power amplifying circuit;
- a temperature compensation circuit configured to receive a second current based on the reference current to compensate temperature characteristics of the bias amplifying circuit and the power amplifying circuit;
- a bias switch circuit comprising a first path switch configured to switch a path of the first current connected between an output node of the current source and the bias amplifying circuit, and a second path switch configured to switch a path of the second current connected between the output node of the current source and the temperature compensation circuit;
- a duty cycle sensing circuit configured to generate a timing control signal based on a duty cycle of a transmission enable signal; and
- a switching control circuit configured to control a first turn-on time of the first path switch during an initial startup period and a second turn-on time of the second path switch during a normal driving period subsequent to the initial startup period to adjust a warm-up time of the power amplifying circuit based on the timing control signal.

10. The amplifying device of claim 9, wherein the timing control signal has a code value corresponding to the duty cycle of the transmission enable signal.

11. The amplifying device of claim 9, wherein the switching control circuit is further configured to control a time interval between the first turn-on time and the second turn-on time by controlling a magnitude of a charging or discharging current based on the timing control signal.

12. The amplifying device of claim 9, wherein the duty cycle sensing circuit comprises:
- a signal detection circuit configured to generate a first switch signal synchronized with the transmission enable signal and a second switch signal in an inverted relationship with the first switch signal;
- a duty cycle signal generating circuit configured to perform a charging operation based on the first switch signal and a discharging operation based on the second switch signal to generate a duty cycle signal; and
- an A/D converter configured to generate the timing control signal having a code value corresponding to a voltage magnitude of the duty cycle signal.

13. The amplifying device of claim 9, wherein the duty cycle sensing circuit comprises:
- a signal detection circuit configured to generate a first switch signal synchronized with the transmission enable signal and a second switch signal in an inverted relationship with the first switch signal;
- a duty cycle signal generating circuit configured to perform a charging operation based on the second switch signal and perform a discharging operation based on the first switch signal to generate a duty cycle signal; and an A/D converter configured to generate the timing control signal having a code value corresponding to the voltage magnitude of the duty cycle signal.

14. The amplifying device of claim 9, wherein the switching control circuit comprises:
 a first constant current source configured to generate a first constant current;
 a second constant current source configured to generate a second constant current;
 a first capacitor circuit configured to perform a charge-charging based on the first constant current to output a first charging voltage;
 a second capacitor circuit configured to perform the charge-charging based on the second constant current to output a second charging voltage;
 a discharging control circuit configured to compare the first charge voltage with a first reference voltage and control output cutoff and discharging of the first and second constant current sources including a level according to the comparison result thereof;
 a discharging circuit configured to discharge each of the first capacitor circuit and the second capacitor circuit in response to a control of the discharging control circuit;
 a first comparison circuit configured to compare the second charging voltage with a second reference voltage to output a first control signal including a level according to the comparison result; and
 a second comparison circuit configured to compare the first charging voltage with the second reference voltage to output a second control signal including a level according to the comparison result thereof.

15. The amplifying device of claim 9, wherein the switching control circuit is further configured to
 control the first path switch to be in a turned-on state and the second path switch to be in an off state in an initial startup period, based on the transmission enable signal, and
 control both the first path switch and the second path switch to be in the turned-on state in the normal driving period.

16. The amplifying device of claim 15, wherein the current source is further configured to
 generate a first reference current during the initial startup period and output the first reference current as a reference current, and
 generate an added combination of the first reference current and a second reference current during the normal driving period to output the reference current,
 wherein the first path switch is configured to
 supply the first reference current to the bias amplifying circuit as the first current in the initial startup period, and
 supply the added combination of the first reference current and the second reference current to the bias amplifying circuit in the normal driving period,
 wherein the second path switch is configured to
 supply the added combination of the first reference current and the second reference current to the temperature compensation circuit in the normal driving period,
 wherein the bias amplifying circuit is configured to
 receive the first current based on the first reference current during the initial startup period or branched from the reference current during the normal driving period to provide the base bias voltage to the power amplifying circuit, and
 wherein the temperature compensation circuit is configured to
 receive the second current branched from the reference current during the normal driving period to compensate temperature characteristics of the bias amplifying circuit and the power amplifying circuit, the second current in the normal driving period being greater than the first current in the normal driving period.

* * * * *